United States Patent [19]

Lum et al.

[11] Patent Number: 5,763,924
[45] Date of Patent: Jun. 9, 1998

[54] CIRCUITS AND METHODS FOR COMPENSATING NON-LINEAR CAPACITANCES TO MINIMIZE HARMONIC DISTORTION

[75] Inventors: Sammy S. Lum, Fremont; William C. Rempfer, Los Altos, both of Calif.

[73] Assignee: Linear Technology Corporation, Milpitas, Calif.

[21] Appl. No.: 647,361

[22] Filed: May 9, 1996

[51] Int. Cl.[6] .......................... H01L 29/76; H01L 29/74
[52] U.S. Cl. ........................ 257/386; 327/341; 327/362
[58] Field of Search .......................... 257/386, 401; 327/341, 362

[56] References Cited

U.S. PATENT DOCUMENTS

| 3,836,791 | 9/1974 | Galloway | 307/228 |
| 4,999,585 | 3/1991 | Burt et al. | |
| 5,172,019 | 12/1992 | Naylor et al. | |
| 5,187,390 | 2/1993 | Scott, III | 307/353 |
| 5,266,820 | 11/1993 | Van Berkel | 257/300 |

OTHER PUBLICATIONS

Hamade, A.R., "Temperature Compensated Quad Analog Switch," *IEEE Journal of Solid-State Circuits*, vol. SC-14, No. 6, Dec. 19, 1979, pp. 944-952.

*Primary Examiner*—Ngân V. Ngô
*Attorney, Agent, or Firm*—Fish & Neave; Robert W. Morris

[57] ABSTRACT

A simple, low-cost circuit and method for linearizing parasitic capacitances of transistor junctions, independent of the process technology employed, are provided. In the preferred embodiment, the parasitic capacitance of a transistor in a track and hold circuit is linearized by providing a pair of diodes that act inversely to the parasitic diodes formed within the integrated circuit during normal tracking operations. Without the diodes of the present invention, the varying input signals cause the parasitic capacitance to vary, thereby causing harmonic distortion in the track and hold circuit. An alternate embodiment of the present invention is also provided in which a second complementary transistor is provided. The inclusion of the complementary transistor results in a second set of parasitic capacitances that are substantially opposite the parasitic capacitances of the track and hold transistor. Additionally, depending on the ratios of the various components, the techniques of the two embodiments may be, combined, such that additional diode may be added even if the complementary transistor technique is utilized.

17 Claims, 5 Drawing Sheets

CIRCUITS AND METHODS FOR COMPENSATING NON-LINEAR CAPACITANCES TO MINIMIZE HARMONIC DISTORTION

BACKGROUND OF THE INVENTION

This invention relates to parasitic capacitances of transistor junctions, particularly in track and hold (T/H) circuits and other circuits which may incorporate T/H circuits. More specifically, the present invention relates to circuits and methods for minimizing non-linear capacitances in T/H and other circuits.

T/H circuits may be used to maintain a constant magnitude output representing an input, for example in an analog-to-digital converter (ADC). Thus, the characteristics of the T/H circuit may be crucial to system accuracy, including the accuracy of any digital data created by an ADC. The T/H circuit typically operates in two different modes, "tracking mode" and "hold mode." In tracking mode, the T/H circuit generally acts as an input voltage follower. In hold mode, the T/H circuit retains as an output signal the input signal voltage level at the time hold mode is initiated. The T/H circuit is typically switched between modes by simply toggling a trigger. When the T/H circuit is triggered back to tracking mode, the T/H circuit output resumes following the input voltage.

There are many known T/H circuits. For example, a simple T/H circuit may be created using a metal oxide semiconductor (NOS) transistor and a capacitor. One limitation with such simple MOS transistor T/H circuits is that parasitic capacitances of transistor junctions vary non-linearly with the voltage across the transistor junctions. The parasitic capacitances are particularly troublesome during tracking mode operations, when the transistor is on and the input voltage changes cause the capacitance to vary. The varying parasitic junction capacitances interact with the remainder of the MOS transistor T/H circuit, causing harmonic distortion in the output of the T/H circuit.

One known solution to the parasitic capacitance problem is to provide additional circuitry to keep a constant reverse bias across the parasitic diodes that effectively form between ground and the source and drain of the transistor. Some of these T/H circuits employ an operational amplifier to prevent a voltage difference across the transistor junctions, thereby linearizing the parasitic junction capacitances. However, not only does this modification suffer the disadvantages of requiring more space and increased cost, but this technique also can only be used in conjunction with process technology that allows connection access to the "anode" of the parasitic diode that effectively forms between the transistor junctions and ground.

In view of the foregoing, it would be desirable to provide a simple, low-cost circuit that linearzes the parasitic capacitances of transistor junctions, particularly in simple T/H circuits.

It would also be desirable to provide a circuit that linearizes the parasitic capacitances of transistor junctions without requiring the use of a particular process technology.

It would be additionally desirable to provide methods for compensating non-linear capacitances to minimize harmonic distortion in both T/H circuits and non T/H circuits.

SUMMARY OF THE INVENTION

It is therefore an object of the invention to provide simple, low-cost circuits that linearizes the parasitic capacitances of transistor junctions, particularly in simple T/H circuits.

It is another object of the invention to provide circuits that linearizes the parasitic capacitances of transistor junctions without requiring the use of a particular process technology.

It is still another object of the invention to provide methods for compensating non-linear capacitances to minimize harmonic distortion in both T/H circuits and non T/H circuits.

In accordance with these and other objects of the invention, simple, low-cost circuits that linearize parasitic capacitance of transistor junctions, which are independent of process technology used, are provided. In one embodiment of the present invention, diodes are coupled between a bias voltage and the source and drain of the transistor. The additional diodes act to linearize the parasitic capacitance such that the total capacitance remains relatively constant. In another embodiment, two complementary transistors are coupled together (i.e., one being p-channel and one being n-channel) such that the parasitic capacitance of each transistor linearizes the parasitic capacitance of the other transistor.

BRIEF DESCRIPTION OF THE DRAWINGS

The above and other objects of the present invention will be apparent upon consideration of the following detailed description taken in conjunction with the accompanying drawings, in which.

DETAILED DESCRIPTION OF THE INVENTION

Track and held (T/H) circuits incorporating the junction-capacitance compensating principles of the present invention are described below. The T/H circuits provided are low-cost and accurate, due in part to the techniques that compensate for the transistor junction parasitic capacitances without requiring complicated additional circuitry (e.g., amplifiers). In addition, the compensation of the provided T/H circuit does not require that a particular process technology be employed.

Figure 1:
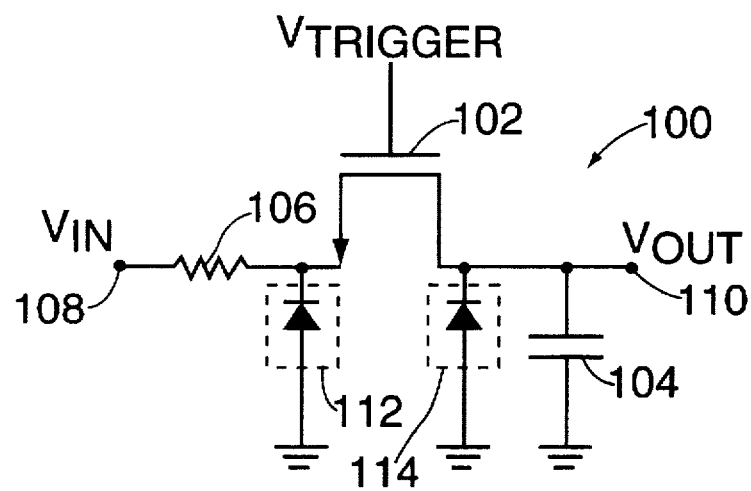
FIG. 1 is a simplified schematic diagram of a known track and hold circuit.

FIG. 1 is a simplified schematic diagram of a known T/H circuit. Referring to FIG. 1, a known T/H circuit 100 employing a metal oxide semiconductor (MOS) transistor 102, and a capacitor 104 is shown. Resistor 106 represents the input source impedance. MOS transistor 102 also includes parasitic junction capacitances that are represented by PJC diodes 112 and 114 at the drain and source, respectively, of MOS transistor 102. PJC diodes 112 and 114 are enclosed in dashed boxes to indicate that rather than being separate components, they represent the p-n junctions of MOS transistor 102.

In ideal operations, an input signal $V_{IN}$ causes the voltage at input node 108 to vary. When the gate of MOS transistor 102 is coupled to a voltage greater than the voltage at input node 108, MOS transistor 102 is on and behaves like a resistor—allowing capacitor 104 to charge and discharge so that the output $V_{OUT}$ at output node 110 follows the input signal $V_{IN}$ (i.e., tracking mode). When the gate of MOS transistor 102 is coupled to a voltage less than the voltage at input node 108, MOS transistor 102 is off—isolating the input signal $V_{IN}$ from capacitor 104 and output node 110 so that output $V_{OUT}$ at output node 110 remains constant at the value of $V_{IN}$ prior to switching modes (i.e., hold mode). Thus, a signal $V_{TRIGGER}$ at the gate of MOS transistor 102 may serve as a trigger between operation of T/H circuit 100 in tracking mode and hold mode.

Figure 2:
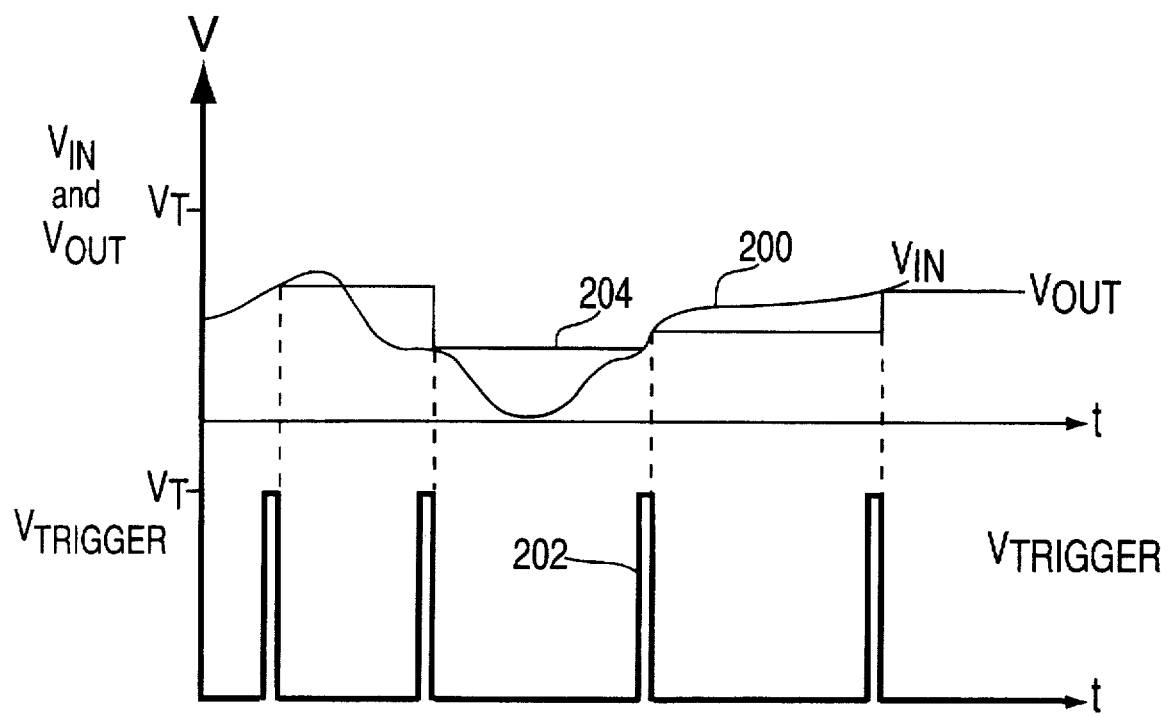
FIG. 2 is a graph illustrating a typical operational profile of the track and hold circuit of FIG. 1.

FIG. 2 illustrates one ideal operation of T/H circuit 100. Referring to FIG. 2, input signal $V_{IN}$ 200 varies over time. At desired times, trigger signal $V_{TRIGGER}$ 202 is briefly toggled above input signal $V_{IN}$ 200. Output signal $V_{OUT}$ 204 follows input signal $V_{IN}$ 200 while trigger signal $V_{TRIGGER}$ 202 exceeds input signal $V_{IN}$ 200, and holds constant at the last value of input-signal $V_{IN}$ 200 when trigger signal $V_{TRIGGER}$ 202 is brought below input signal $V_{IN}$ 200.

Typical operations, however, are not ideal and therefore, the output of T/H circuit 100 of FIG. 1 suffers the disadvantage of harmonic distortion due to parasitic capacitances of the junctions in MOS transistor 102, as described above. These problems are particularly troublesome for integrated circuit T/H circuits.

Figure 3:
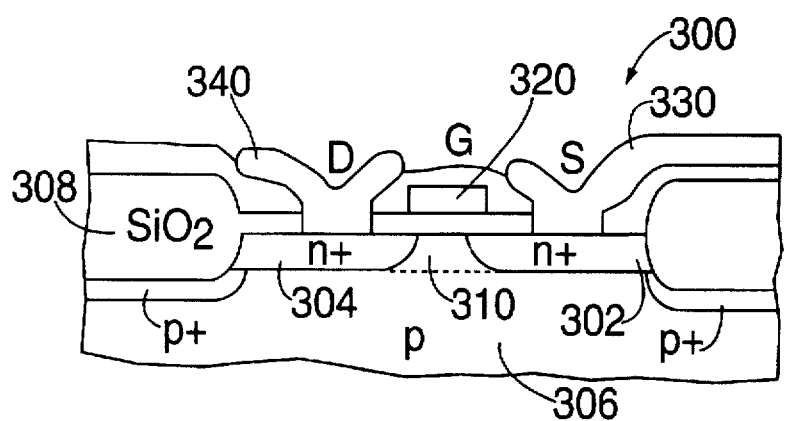
FIG. 3 is a cross-sectional view of a conventional integrated circuit structure for an n-channel MOSFET.

FIG. 3 depicts a cross-sectional view of a conventional integrated circuit structure for an n-channel metal oxide semiconductor field effect transistor (MOSFET) 300, which could be used as MOS transistor 102 in FIG. 1. Referring to FIG. 3, n+-regions 302 and 304 are diffused or implanted into p-type silicon substrate 306. Oxide layer 308 is above p-type substrate 306. A thin portion of oxide layer 308 separates polysilicon gate 320 of MOSFET 300 from p-type silicon substrate 306. Metal terminals 330 and 340 are coupled to n+-regions 302 and 304, respectively.

Of terminals 30 and 340, the terminal connected to the n+-region 302 or 304 supplying the majority carrier of the channel of MOSFET 300 (which is the more negative terminal for an n-channel device) is typically designated the source (S), and the other terminal is designated the drain (D), although this designation is arbitrary with respect to terminals 330 and 340 in FIG. 3. Between the corresponding source and drain n+-regions 302 and 304 of MOSFET 300 is a channel 310 of p-type substrate 306.

In normal operations gate 320 controls the flow of current between source terminal 330 and drain terminal 340 by generating an electric field in channel 310 between source n+-region 302 and drain n+-region 304. This field is produced by applying a voltage at gate 320. Substrate 306 is often coupled to ground to avoid forward biasing either of the substrate-source ant substrate-drain p-n junctions.

From FIG. 3 it will be clear to persons skilled in the art that one source of parasitic capacitance in MOSFET 300 is the junction between the drain n+-region 302 and the grounded p-type substrate 306. Likewise, another source of parasitic capacitance is the junction between the source n+-region 304 and the grounded p-type substrate 306.

Figure 4:
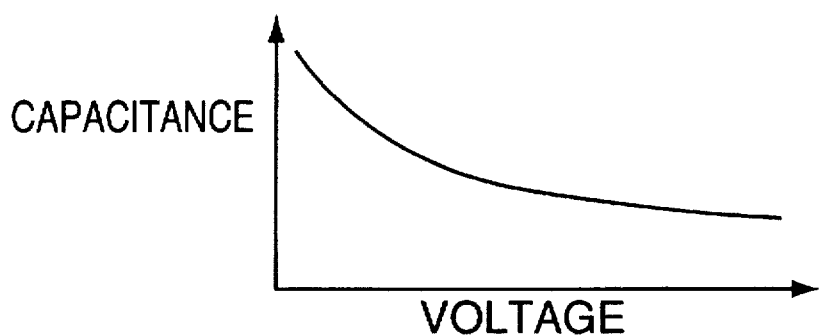
FIG. 4 is a graph illustrating transistor junction parasitic capacitance as a function of voltage across the transistor junction for the track and hold circuit of FIG. 1.

Persons skilled in the art will also recognize that these respective parasitic junction capacitances typically vary with the voltage across the respective junction. FIG. 4 is a graph illustrating the parasitic junction capacitances of either of the drain-substrate or source-substrate junctions as a function of the reverse bias voltage across the respective junction.

Returning to FIG. 1, as mentioned above, the voltage-variable parasitic junction capacitances are depicted by PJC diodes 112 and 114. Referring again to the operation of T/H circuit 100 of FIG. 1, in tracking mode when MOS transistor 102 is on (i.e., when trigger signal $V_{TRIGGER}$ exceeds the voltage of input signal $V_{IN}$), input signal $V_{IN}$ at input node 108 changes the voltage across PJC diodes 112 and 114, causing the parasitic junction capacitances represented by PJC diodes 112 and 114 to vary. The voltage-varying parasitic junction capacitances interact with the source impedance represented by resistor 106 an; the resistance formed by MOS transistor 102 being on, causing harmonic distortion in output $V_{OUT}$ at output node 110.

In hold mode when transistor 102 is off, as mentioned above output node 110 is isolated from varying input signal $V_{IN}$ and voltage-varying PJC diode 112. Because of this isolation, output $V_{OUT}$ at output node 110 is constant. Thus, the voltage across PJC diode 114, and the parasitic junction capacitance represented by PJC diode 114, remain constant. Accordingly, harmonic distortion at output node 110 is essentially not an issue in hold mode. The T/H circuit 100 merely holds whatever distortion was present when T/H circuit 100 was triggered to hold mode.

To compensate for voltage-varying parasitic junction capacitances, some known circuits employ an operational amplifier (op-amp) to prevent a voltage difference from being established across the drain-substrate and source-substrate transistor junctions.

Figure 5:
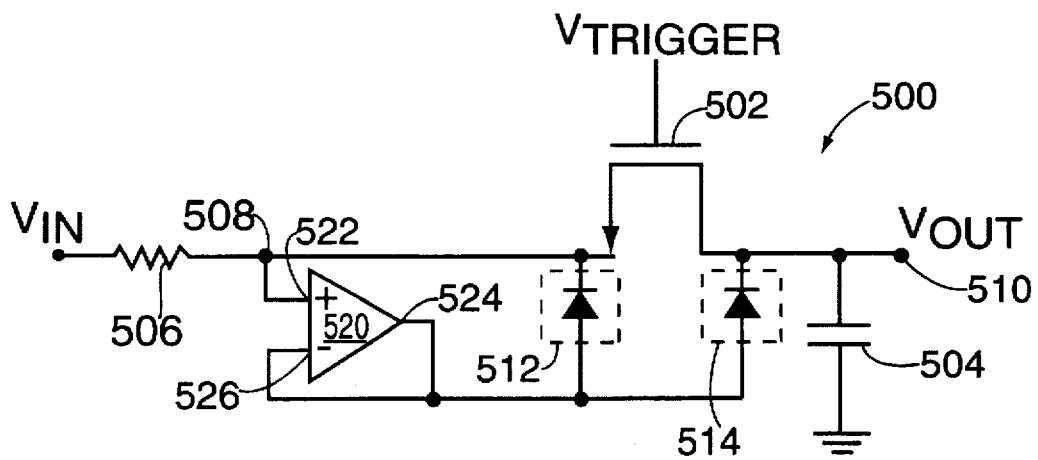
FIG. 5 is a schematic diagram of a prior art track and hold circuit, employing an operational amplifier for linearizing transistor junction parasitic capacitances.

FIG. 5 show one such prior art T/H circuit 500 which uses op-amp 520 to linearize parasitic junction capacitances by preventing a voltage difference across the transistor junctions. However, one disadvantage of T/H circuit 500 of FIG. 5 is that T/H circuit 500 requires access to the "anode" of PJC diodes 512 and 514 for connection of op-amp 520. Such a requirement limits the processes available to manufacture such a circuit, as many processes produce integrated circuits in which the substrate or other "anode" of the transistor junctions may not be accessed. There are two fundamental types of CMOS processes, n-well and p-well. For an n-channel transistor, n-well CMOS produces a p-type substrate common to the whole integrated circuit (i.e., other circuit elements). The p-type substrate is the "anode" of the n-channel transistor junctions. Alternatively, p-well CMOS produces a p-type well in an n-type substrate.

The p-type sell may be the "substrate" for an n-channel transistor formed by adding $n^+$ regions to the p-type well. The p-type well, the "anode" of the n-channel transistor junctions, is not common to the whole integrated circuit. Accordingly, access to the "anode" of an n-channel transistor is possible in p-well CMOS, but not n-well CMOS technology. Likewise, persons skilled in the art will recognize that for p-channel transistors, access to the "anode" is possible in n-well CMOS, but not p-well CMOS technology. Another limitation of T/H circuit 500 of FIG. 5 is that the inclusion of op-amp 520 on an integrated circuit requires significant space and components, which translates to increased cost.

Referring to. FIG. 5, MOS transistor 502 and capacitor 504 are substantially like, and behave substantially like MOS transistor 102 and capacitor 104 described in connection with FIGS. 1–3. Similarly, resistor 506 represents the input source impedance in FIG. 5. In integrated circuit form, the MOS transistor 502 for T/H circuit 500 in FIG. 5 is in a p-well and does not need to be grounded to prevent forward biasing of the transistor junctions, unlike p-type substrate 306 of FIG. 3. Instead, the substrate (p-well) of T/H circuit 500 in FIG. 5 is coupled to output terminal 524 of op-amp 520 and to negative input terminal 526 of op-amp 520. Positive input terminal 522 of op-amp 520 is coupled to input node 508. As in FIG. 1, parasitic junction capacitances of MOS transistor 502 of FIG. 5 are depicted by PJC diodes 512 and 514, which are enclosed by dashed boxes on FIG. 5 to show that they are not actual circuit components.

In operation of T/H circuit 500, when MOS transistor 502 is on (i.e., when trigger signal $V_{TRIGGER}$ exceeds input signal $V_{IN}$), MOS transistor 502 behaves as a resistor, and op-amp 520 operates to eliminate voltage across PJC diodes 512 and 514. Accordingly, the voltage-variable parasitic capacitance of the source-substrate and drain-substrate junctions of MOS transistor 502 is linearized.

Figure 6:
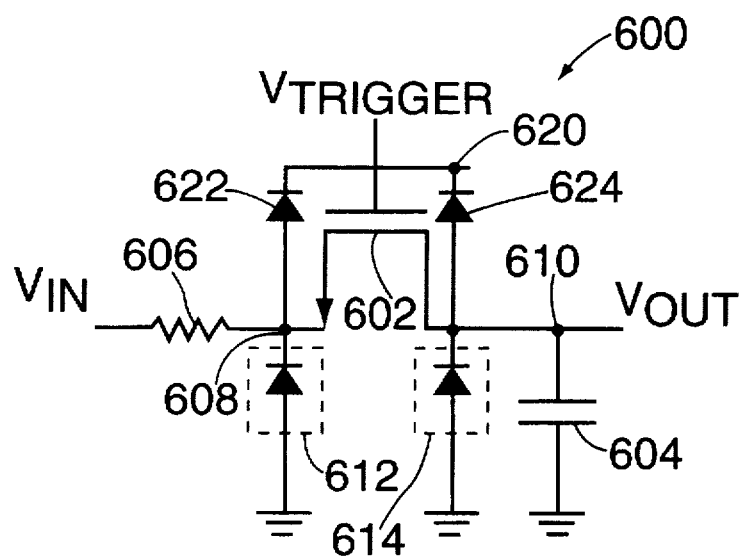
FIG. 6 is a schematic diagram of one embodiment of a parasitic-junction-capacitance-compensated track and hold circuit, in accordance with the principles of the present invention.

In accordance with the principles of the present invention, FIG. 6 provides a schematic diagram of a low-cost, parasitic-junction-capacitance-compensated T/H circuit, which does not require specific manufacturing processes that allow connection to the substrate or other "anode" of the transistor junctions.

Referring to FIG. 6, a T/H circuit 600 employing MOS transistor 602, and a capacitor 604 is shown. Voltage-variable parasitic junction capacitances of MOS transistor 602, are represented by PJC diodes 612 and 614 at the drain and source of MOS transistor 602. As in FIG. 1, PJC diodes 612 and 614 are enclosed in dashed boxes in FIG. 6 to indicate that rather than being separate components, they represent the p-n junctions of MOS transistor 602. Similarly, resistor 606 represents the input source impedance in FIG. 6. First and second compensation junction capacitance ("CJC") diodes 622 and 624 are coupled between input node 608 and bias voltage node 620, and output node 610 and bias voltage node 620, respectively. The anode of CJC diode 622 is coupled to input node 608, and the cathode of CJC diode 622 is coupled to bias voltage node 620. Likewise, the anode and cathode of CJC diode 624 are coupled to output node 610 and voltage bias node 620, respectively.

In operation, an input signal $V_{IN}$ causes the voltage at input node 608 to vary. When the gate of MOS transistor 602 is coupled to a voltage greater than the voltage at input node 608, MOS transistor 602 is on and behaves like a resistor—allowing capacitor 604 to charge and discharge so that the output $V_{OUT}$ at output node 610 follows the input signal $V_{IN}$ (i.e., tracking mode). When the gate of the MOS transistor 602 is coupled to a voltage less than the voltage at input node 608, MOS transistor 602 is off—isolating the input signal $V_{IN}$ from capacitor 604 and output node 610 so that output $V_{OUT}$ at output node 610 remains constant (i.e., hold mode). Thus, a signal $V_{TRIGGER}$ at the gate of MOS transistor 602 may serve as a trigger between operation of T/H circuit 600 in tracking mode and hold mode.

When MOS transistor 602 is on (because trigger signal $V_{TRIGGER}$ exceeds the voltage of input signal $V_{IN}$), input signal $V_{IN}$ at input node 608 changes the voltage across PJC diodes 612 and 614, causing the parasitic junction capacitances represented by PJC diodes 612 and 614 to vary. However, in accordance with the principles of the present invention, the voltage across, and thus the junction capacitances of, CJC diodes 622 and 624 varies in the opposite direction of those of PJC diodes 612 and 614. By selecting the appropriate size for CJC diodes 622 and 624, the net parasitic junction capacitances can be linearized. The process of selecting the appropriate size for CJC diodes 622 and 624, or "ratioing," is empirical based on a given process.

Figure 7:
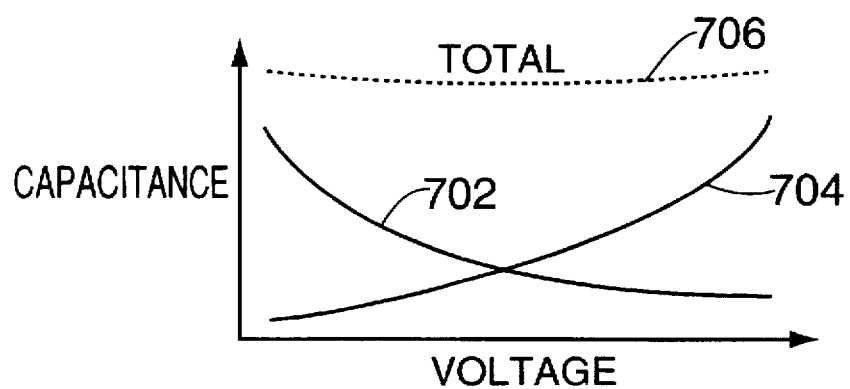
FIG. 7 is a graph illustrating the combined effect of transistor junction parasitic capacitance and compensating junction capacitance, in accordance with the principles of the present invention.

FIG. 7 is a graph illustrating the combined effect of the transistor junction parasitic capacitance and the compensating junction capacitance in accordance with the principles of the present invention.

Referring to FIG. 7, curve 702 represents the parasitic junction capacitance of either of PJC diodes 612 or 614 as a function of varying voltage at input node 608 across the transistor junction. Curve 704 represents the parasitic junction capacitance of either of CJC diodes 622 or 624 as a function of varying voltage at input node 608. As can be seen from FIG. 7, the two voltage-variable capacitances curves 702 and 704 combine to yield total capacitance curve 706, which is relatively constant over varying voltage at input node 608.

This linearization of the parasitic junction capacitances, represented by PJC diodes 612 and 614 in FIG. 6, greatly improves the harmonic distortion at output node 610 when MOS transistor 602 is on. And, this linearization of the parasitic junction capacitances is not limited to manufacturing processes which permit access to the substrate or other "anode" of the transistor junctions.

Figure 8:
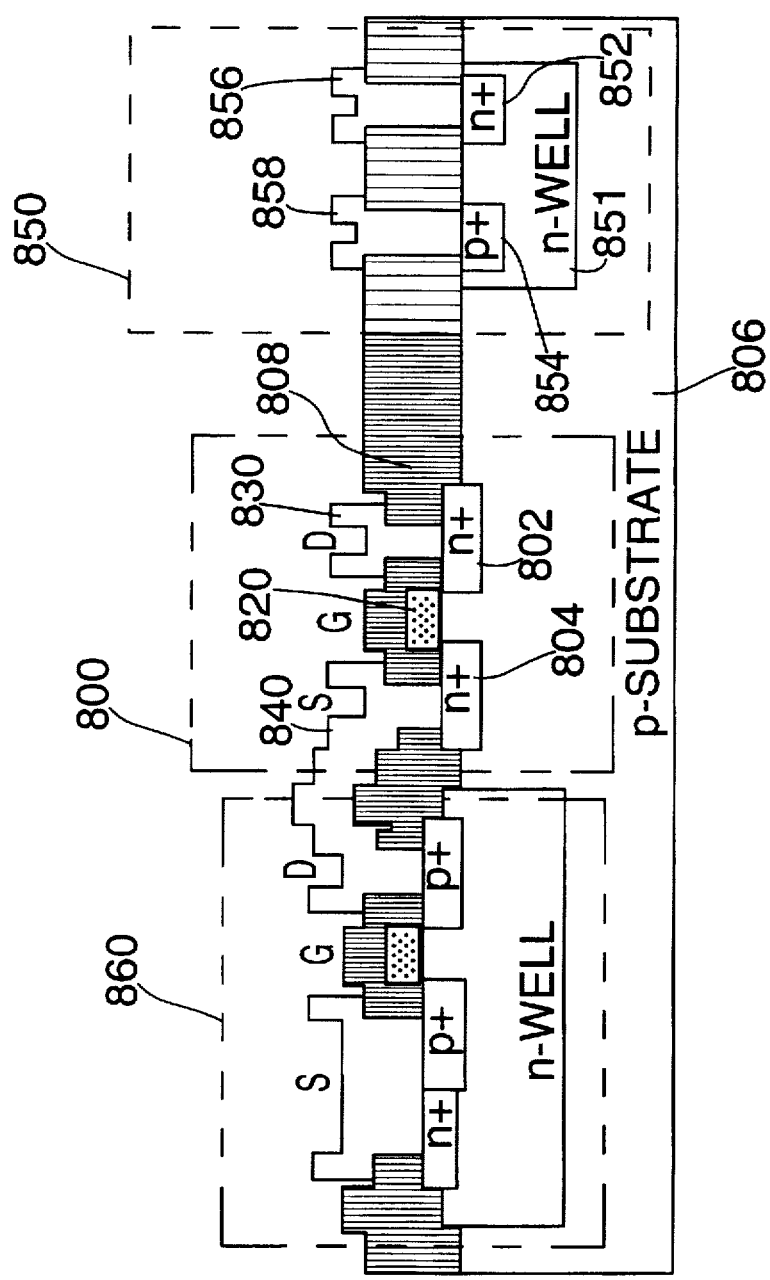
FIG. 8 is a cross-sectional view of an integrated circuit structure for a parasitic-junction-capacitance-compensated n-channel MOSFET, in accordance with the principles of the present invention.

FIG. 8 is a cross-sectional view of an integrated circuit structure for parasitic-junction-capacitance-compensating an n-channel MOSFET, in accordance with the principles of the present invention.

Referring to FIG. 8, a cross-sectional view of an integrated circuit for parasitic-junction-capacitance-compensating MOSFET 800, which could be used as MOS transistor 602 in FIG. 6, is shown. As in FIG. 3, n+-regions 802 and 804 are diffused or implanted into p-type silicon substrate 806. Oxide layer 808 is above p-type substrate 806. A thin portion of oxide layer 808 separates polysilicon gate 820 of MOSFET 800 from p-type silicon substrate 806. Metal terminals 830 and 840 are coupled to n+-regions 802 and 804 respectively.

To form each of the CJC diodes 850 in accordance with the principles of the present invention, an n-well 851 is diffused or implanted into p-type silicon substrate 806. N+-region 852 and p+-region 854 are diffused or implanted into n-well 850. Metal terminals 856 and 858 are coupled to n+-region 852 and p+-region 854, respectively, for connection to bias voltage. Alternatively, either of the CJC diodes may be formed by using the source/drain diffusions or implants of p-channel transistor 860. To do so, however, p-channel transistor 860 must be turned off.

Figure 9:
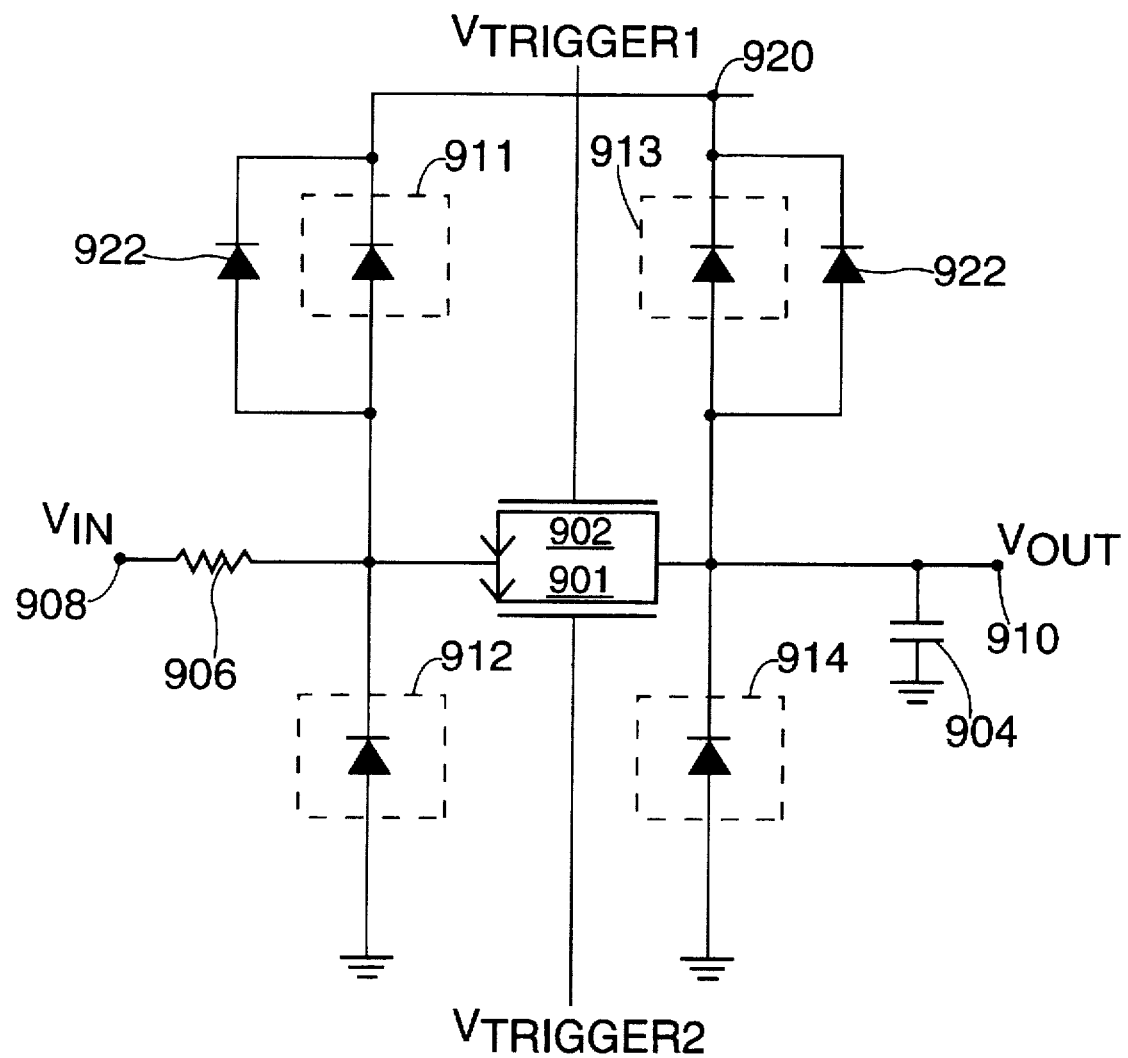
FIG. 9 is a schematic diagram of another embodiment of a parasitic-capacitance-compensated track and hold circuit and method, in accordance with the principles of the present invention.

FIG. 9 is a schematic diagram of an alternate embodiment of a parasitic-capacitance-compensated T/H circuit 900 constructed in accordance with the principles of the present invention.

Referring to FIG. 9, MOS transistors 901 and 902 are complimentary in conductivity and are coupled at their drains and sources. Capacitor 904 is coupled to the drains of MOS transistors 901 and 902. Resistor 906 represents the input source impedance of T/H circuit 900. Parasitic junction capacitances of MOS transistors 901 and 902 are represented by PJC diodes 911 and 913 and 912 and 914, respectively. PJC diodes 911, 912, 913 and 914 are enclosed in dashed boxes to indicate that rather than being separate components, they represent the p-n junctions of MOS transistors 901 and 902.

As can be seen from FIG. 9, two complementary pairs of PJC diodes (911 and 912, 913 and 914) are present in T/H circuit 900 that, in accordance with the principles of the present invention, have offsetting effects. Depending on the geometries selected for the junctions of MOS transistors 901 and 902, one or more compensation junction capacitance ("CJC") diode(s) 922 may also be added to T/H circuit 900 to further linearize parasitic junction capacitances. CJC diodes 922 may, for example, be added as needed: (1) between the source of MOS transistor 902 and bias voltage node 920; (2) between the drain of MOS transistor 902 and bias voltage node 920; or (3) one CJC diode 922 each between the source and drain of MOS transistor 902 and bias voltage node 920. The anode of a first CJC diode 922 may be coupled to the source of MOS transistor 902, and the cathode of first CJC diode 922 to bias voltage node 920. Likewise, the anode of a second CJC diode 922 may be coupled to the drain of MOS transistor 902, and the cathode of second CJC diode 922 to bias voltage node 920. Alternatively, either or both of first and second CJC diodes 922 may be coupled between ground and the drain or source of MOS transistor 901 (not shown on FIG. 9). Thus, the parasitic junction capacitances of the circuit may be linearized to improve harmonic distortion at output node 910. And, this linearization of parasitic-junction capacitances is not limited to manufacturing processes which permit access to the substrate or other anode of the transistor-junctions.

In operation, an input signal $V_{IN}$ causes the voltage at input node 908 to vary. When the gate of MOS transistor 902 is coupled to a voltage greater than the voltage at input node 908, and the gate of MOS transistor 901 is coupled to a voltage lower than the voltage at input node 908, the switch comprised of MOS transistors 901 and 902 is on and behaves like a resistor—allowing capacitor 904 to charge and discharge so that the output $V_{OUT}$ at output node 910 follows the input signal $V_{IN}$ (i.e., tracking mode). When the gate of the MOS transistor 902 is coupled to a voltage less than the voltage at input node 908 or the gate of the MOS transistor 901 is coupled to a voltage greater than the voltage at input node 908, the switch comprised of MOS transistors 901 and 902 is off-isolating the input signal $V_{IN}$ from capacitor 904 and output node 910 so that output $V_{OUT}$ at output node 910 remains constant (i.e., hold mode). Thus, signals $V_{TRIGGER1}$ and $V_{TRIGGER2}$ at the gates of MOS transistors 901 and 902 may serve as a trigger between operation of T/H circuit 900 in tracking mode and hold mode.

When the switch comprised of MOS transistors 901 and 902 is on, input signal $v_{in}$ at input node 908 changes the voltage across PJC diodes 912 and 914, causing the parasitic junction capacitances represented by PJC diodes 912 and 914 to vary. In addition, the voltage across, and thus the junction capacitances of, PJC diodes 911 and 913 varies in the opposite direction of those of PJC diodes 912 and 914. And, the voltage across, and thus the junction capacitances of, any CJC diodes 922 added to T/H circuit 900 varies. The parasitic junction capacitances represented by PJC diodes 911 and 913 works to linearize parasitic junction capacitances represented by PJC diodes 912 and 914. Also, by selecting the appropriate size for CJC diodes 922, as needed, the net parasitic junction capacitances can be further linearized.

It will be apparent to persons of ordinary skill in the art that, although the present invention has been discussed above with reference to FIGS. 6–9, wherein the T/H circuit transistor comprises a MOSFET transistor, the present invention is applicable to other circuit configurations and types of input devices as well. For example, a JFET may be employed instead of a MOSFET. It will be further apparent that either p-channel or n-channel MOSFETs or JFETs may be used.

In addition, persons skilled in the art will recognize that methods other than the discussed implantation or diffusion may be employed in manufacturing integrated circuits that may take advantage of the principles of the resent invention.

Persons skilled in the art will also appreciate that other circuits exist or providing a track and hold circuit, and that such circuits will likewise benefit from compensation of the parasitic junction capacitances in accordance with the principles of the present invention.

Additionally, although the present invention has been discussed above with reference to a track and hold circuit, other uses exist for compensation of parasitic junction capacitances in accordance with the principles of the present invention.

Persons skilled in the art will thus appreciate that the present invention can be practiced by other than the described embodiments, which are presented for purposes of illustration and not of limitation, and thus the present invention is limited only by the claims which follow.

What is claimed is:

1. A method of linearizing parasitic junction capacitances in a circuit employing a transistor having drain, gate and source terminals, said method comprising the steps of:

providing a bias voltage to the circuit at a bias voltage terminal;

inserting a first diode between the source terminal of the transistor and the bias voltage terminal; and inserting a second diode between the drain terminal of the transistor and the bias voltage terminal.

2. A method of linearizing parasitic junction capacitances in an integrated circuit track and hold circuit, employing a transistor having drain, gate and source terminals, said method comprising the steps of:

receiving a voltage varying input at the source terminal of the transistor;

receiving a trigger input at the gate terminal of the transistor;

compensating for parasitic junction capacitances of the transistor by providing a bias voltage at a bias voltage terminal, adding a first diode between the source terminal of the transistor and the bias voltage terminal, and adding a second diode between the drain terminal of the transistor and the bias voltage terminal;

providing an output at the drain terminal of the transistor.

3. A parisitic-junction-capacitance-compensated circuit comprising:

a bias voltage terminal;

a transistor having source, drain and gate terminals;

a first diode, coupled between the drain terminal and the bias voltage terminal, that compensates for parasitic junction capacitance of the drain terminal; and a second diode, coupled between the source terminal and the bias voltage terminal, that compensates for parasitic junction capacitance of the source terminal.

4. A parasitic-junction-capacitance-compensated track and hold circuit having an input and an output and a trigger, said track and hold circuit comprising:

a bias voltage terminal;

a transistor having source, drain and gate terminals;

a capacitor coupled between the drain terminal and ground;

a first diode, coupled between the drain terminal and the bias voltage terminal, that compensates parasitic junction capacitance of the drain terminal; and a second diode, coupled between the source terminal and the bias voltage terminal, that compensates for parasitic junction capacitance of the source terminal;

wherein a voltage varying input signal is received at the input, and upon the trigger, alternatively outputting: (1) a varying signal substantially equal to the input signal; or (2) a constant signal substantially equal to the value of the input signal when the trigger was received.

5. The track and hold circuit of claim 4, wherein the bias voltage terminal, the transistor, the capacitor and the first and second diodes comprise a single integrated circuit.

6. The track and hold circuit of claim 4, wherein the transistor is an n-type transistor.

7. The track and hold circuit of claim 4, wherein the transistor is a p-type transistor.

8. A parasitic-junction-capacitance-compensated track and hold circuit comprising:

a bias voltage node;

a transistor having a source, a drain and a gate;

a capacitor coupled between the drain and ground;

a first diode, coupled between the drain and the bias voltage node, that compensates for parasitic junction capacitance of the drain; and a second diode, coupled between the source and the bias voltage node, that compensates for parasitic junction capacitance of the source;

wherein a voltage varying input signal is received at the source and a trigger signal is received at the gate to alternatively provide as output at the drain: (1) the voltage varying input signal, or (2) a constant signal of voltage substantially equal to the input signal upon receipt of the trigger signal.

9. The track and hold circuit of claim 8, wherein the bias voltage node, the transistor, the capacitor and the first and second diodes comprise a single integrated circuit.

10. The track and hold circuit of claim 8, wherein the transistor is an n-type transistor.

11. The track and hold circuit of claim 8, wherein the transistor is a p-type transistor.

12. A parasitic-junction-capacitance-compensated track and hold circuit comprising:

first and second transistors of complementary types, each transistor having a source, a drain and a gate, and there being parasitic junction capacitance associated with the source-gate and drain-gate junctions, the first and second transistors having commonly coupled sources and commonly coupled drains;

a capacitor coupled between ground and the drains of the first and second transistor;

wherein a voltage varying input signal is received at the sources of the first and second transistors and a trigger signal is received at the gates of the first and second transistors to alternatively provide as output at the drain: (1) the voltage-varying input signal, or (2) a constant signal of voltage substantially equal to the input signal upon receipt of the trigger signal; and wherein the parasitic capacitances of the source-gate and drain-gate junctions of the second transistor linearize the parasitic capacitances of the source-gate and drain-gate junctions of the first transistor.

13. The track and hold circuit of claim 12, wherein the first and second transistors and the capacitor comprise a single integrated circuit.

14. The track and hold circuit of claim 13, further comprising:

a bias voltage terminal;

a first diode, coupled between the drain of the first transistor and the bias voltage terminal, that compensates for parasitic junction capacitances of the drain of the first transistor; and a second diode, coupled between the source of the first transistor and the bias voltage terminal, that compensates for parasitic junction capacitance of the source of the first transistor.

15. The track and hold circuit of claim 14, wherein the first and second diodes further comprise the single integrated circuit.

16. The track and hold circuit of claim 13, further comprising:

a bias voltage terminal;

a first diode, coupled between the drain of the first transistor and the bias voltage terminal, that compensates for parasitic junction capacitances of the drain of the second transistor; and a second diode, coupled between the source of the first transistor and the bias voltage terminal, that compensates for parasitic junction capacitance of the source of the second transistor.

17. The track and hold circuit of claim 16, wherein the first and second diodes further comprise the single integrated circuit.

* * * * *